(12) United States Patent
Hu et al.

(10) Patent No.: US 9,443,868 B1
(45) Date of Patent: Sep. 13, 2016

(54) SEMICONDUCTOR MEMORY DEVICE AND METHOD OF MANUFACTURING THE SAME

(71) Applicant: KABUSHIKI KAISHA TOSHIBA, Minato-ku (JP)

(72) Inventors: Ming Hu, Yokkaichi (JP); Toshiyuki Takewaki, Yokkaichi (JP); Masahisa Sonoda, Yokkaichi (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/848,870

(22) Filed: Sep. 9, 2015

Related U.S. Application Data

(60) Provisional application No. 62/135,379, filed on Mar. 19, 2015.

(51) Int. Cl.
  *H01L 27/11* (2006.01)
  *H01L 27/115* (2006.01)

(52) U.S. Cl.
  CPC ... *H01L 27/11582* (2013.01); *H01L 27/11556* (2013.01)

(58) Field of Classification Search
  CPC .................. H01L 27/11582; H01L 27/11556
  See application file for complete search history.

(56) References Cited

U.S. PATENT DOCUMENTS

| 7,936,004 | B2 | 5/2011 | Kito et al. |
| 2007/0252201 | A1 | 11/2007 | Kito et al. |
| 2015/0115345 | A1* | 4/2015 | Nowak ............ H01L 27/11582 257/314 |

* cited by examiner

*Primary Examiner* — Roy Potter
*Assistant Examiner* — Paul Patton
(74) *Attorney, Agent, or Firm* — Oblon, McClelland, Maier & Neustadt, L.L.P.

(57) ABSTRACT

According to an embodiment, a semiconductor memory device comprises: a memory string comprising memory cells; and a contact electrically connected to one end of the memory string. The memory string comprises: control gate electrodes stacked above a first semiconductor layer; a second semiconductor layer having one end connected to the first semiconductor layer and having as its longitudinal direction a direction perpendicular to the first semiconductor layer, the second semiconductor layer facing the control gate electrodes; and a charge accumulation layer positioned between the control gate electrode and the second semiconductor layer. The contact has a plate-like shape whose longitudinal direction is a first direction, the contact has its lower surface connected to the first semiconductor layer, and the contact has a height of at least part of its upper surface lower than a height of an upper surface of the second semiconductor layer.

18 Claims, 15 Drawing Sheets

US 9,443,868 B1

SEMICONDUCTOR MEMORY DEVICE AND METHOD OF MANUFACTURING THE SAME

CROSS-REFERENCE TO RELATED APPLICATIONS

This application is based upon and claims the benefit of U.S. Provisional Patent Application No. 62/135,379, filed on Mar. 19, 2015, the entire contents of which are incorporated herein by reference.

FIELD

Embodiments described herein relate to a semiconductor memory device and a method of manufacturing the same.

BACKGROUND

Description of the Related Art

A flash memory that stores data by accumulating a charge in a charge accumulation layer, is known. Such a flash memory is connected by a variety of systems such as NAND type or NOR type, and configures a semiconductor memory device. In recent years, increasing of capacity and raising of integration level of such a nonvolatile semiconductor memory device have been proceeding. Moreover, a semiconductor memory device in which memory cells are disposed three-dimensionally (three-dimensional type semiconductor memory device) has been proposed to raise the integration level of the memory.

DETAILED DESCRIPTION

A semiconductor memory device according to an embodiment comprises: a memory string comprising a plurality of memory cells connected in series therein; and a contact electrically connected to one end of the memory string. The memory string comprises: a plurality of control gate electrodes stacked above a first semiconductor layer; a second semiconductor layer having one end connected to the first semiconductor layer and having as its longitudinal direction a direction perpendicular to the first semiconductor layer, the second semiconductor layer facing the plurality of control gate electrodes; and a charge accumulation layer positioned between the control gate electrode and the second semiconductor layer. The contact has a plate-like shape whose longitudinal direction is a first direction, the contact has its lower surface connected to the first semiconductor layer, and the contact has a height of at least part of its upper surface lower than a height of an upper surface of the second semiconductor layer.

Next, nonvolatile semiconductor memory devices according to embodiments will be described in detail with reference to the drawings. Note that these embodiments are merely examples, and are not shown with the intention of limiting the present invention. Moreover, each of the drawings of the nonvolatile semiconductor memory devices employed in the embodiments below is schematic, and thicknesses, widths, ratios, and so on, of layers are different from those of the actual nonvolatile semiconductor memory devices.

The embodiments below relate to nonvolatile semiconductor memory devices having a structure in which a plurality of MONOS (Metal-Oxide-Nitride-Oxide-Semiconductor) type memory cells (transistors) are provided in a height direction, each of the MONOS type memory cells including: a semiconductor layer acting as a channel provided in a column shape perpendicularly to a substrate; and a gate electrode layer provided on a side surface of the semiconductor layer via a charge accumulation layer. However, this is also not intended to limit the present invention, and the present invention may be applied also to a memory cell of another form of charge accumulation layer, for example, a SONOS (Semiconductor-Oxide-Nitride-Oxide-Semiconductor) type memory cell, or a floating gate type memory cell, and so on.

As is mentioned above, the semiconductor memory devices according to embodiments include the "first semiconductor layer". Here, as the "first semiconductor layer", a semiconductor substrate or a semiconductor layer (conductive layer) provided above a semiconductor substrate can be applied.

First Embodiment

Figure 1:
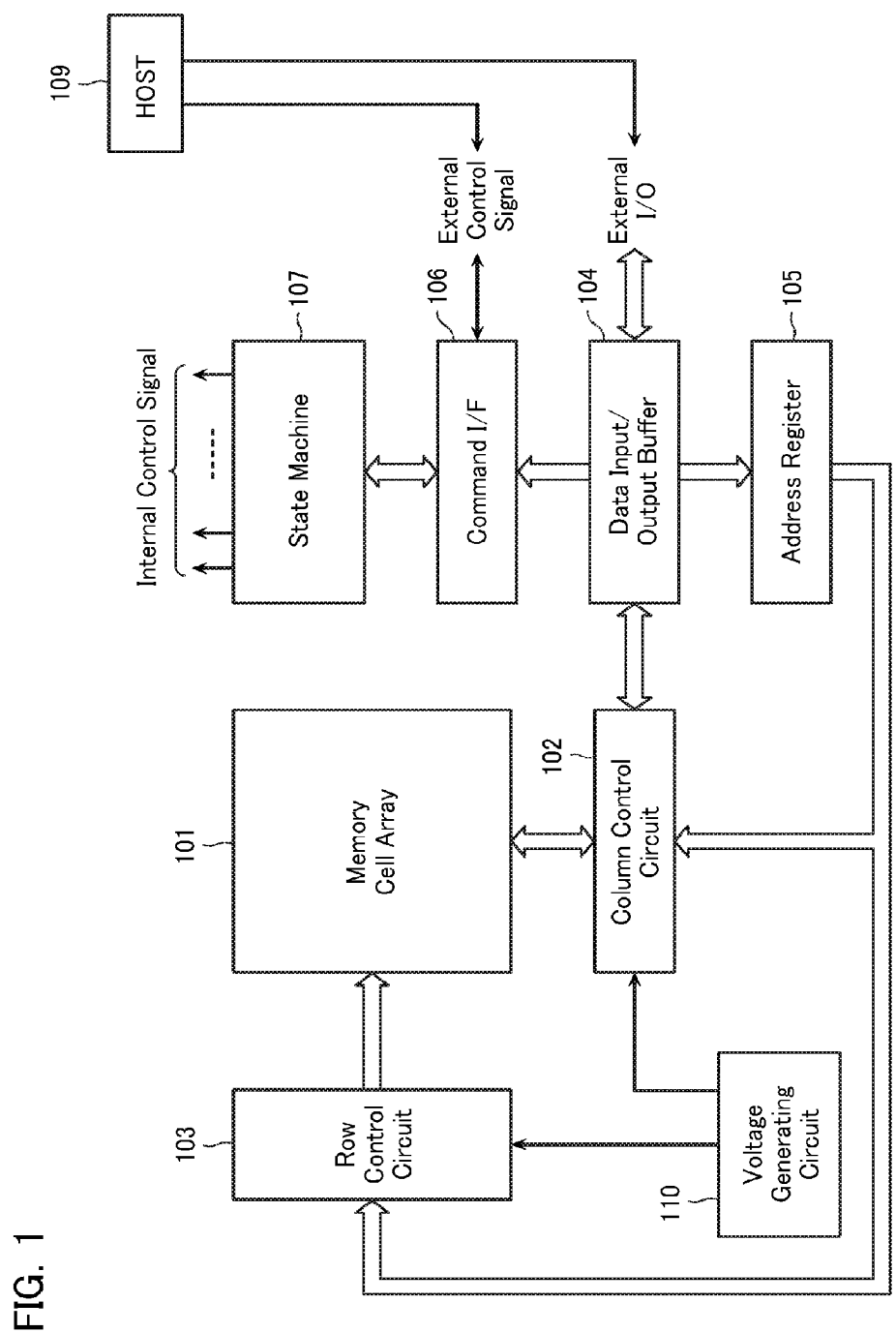
FIG. 1 is a block diagram of a nonvolatile semiconductor memory device according to a first embodiment.

FIG. 1 is a block diagram of a nonvolatile semiconductor memory device according to a first embodiment. This nonvolatile semiconductor memory device includes a memory cell array 101 comprising: a plurality of memory cells MC; and a bit line BL and a word line WL connected to these memory cells MC. Provided in a periphery of this memory cell array 101 are a column control circuit 102 and a row control circuit 103. The column control circuit 102 controls the bit line BL and performs data erase of the memory cell, data write to the memory cell, and data read from the memory cell. The row control circuit 103 selects the word line WL and applies a voltage for data erase of the memory cell, data write to the memory cell, and data read from the memory cell.

A data input/output buffer 104 is connected to an external host 109, via an I/O line, and receives write data, receives an erase command, outputs read data, and receives address data or command data. The data input/output buffer 104 sends received write data to the column control circuit 102, and receives data read from the column control circuit 102 to be outputted to external. Address data supplied to the data input/output buffer 104 from external is sent to the column control circuit 102 and the row control circuit 103 via an address register 105.

Moreover, a command supplied to the data input/output buffer 104 from the host 109 is sent to a command interface 106. The command interface 106 receives an external control signal from the host 109, determines whether data inputted to the data input/output buffer 104 is write data or command data or address data, and, if command data, receives the data and transfers the data to a state machine 107 as a command signal.

The state machine 107 performs management of this nonvolatile memory overall, receives command data from the host 109, via the command interface 106, and performs management of read, write, erase, input/output of data, and so on.

In addition, it is also possible for the external host 109 to receive status information managed by the state machine 107 and judge an operation result. Moreover, this status information is utilized also in control of write and erase.

Furthermore, the state machine 107 controls a voltage generating circuit 110. This control enables the voltage generating circuit 110 to output a pulse of any voltage and any timing.

Now, the pulse formed by the voltage generating circuit 110 can be transferred to any wiring line selected by the column control circuit 102 and the row control circuit 103. These column control circuit 102, row control circuit 103, state machine 107, voltage generating circuit 110, and so on, configure a control circuit in the present embodiment.

Figure 2:
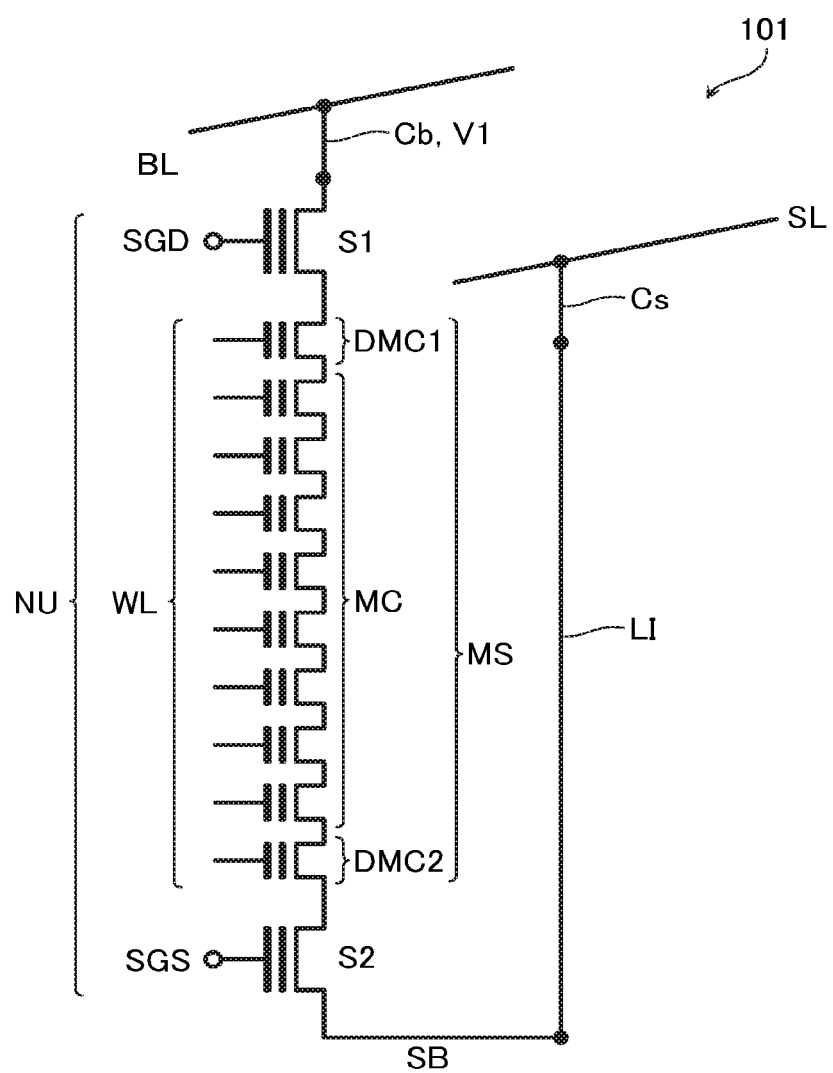
FIG. 2 is a circuit diagram showing a configuration of part of the same nonvolatile semiconductor memory device.

Next, a circuit configuration of the memory cell array 101 will be described with reference to FIG. 2. FIG. 2 is a circuit diagram showing a structure of part of the memory cell array 101.

As shown in FIG. 2, the memory cell array 101 according to the present embodiment comprises: a plurality of the memory cells MC connected in series; and dummy cells DMC1 and DMC2 respectively connected to both ends of these memory cells MC. Control gates of these plurality of memory cells MC and the dummy cells DMC1 and DMC2 are respectively connected to the word lines WL. Moreover, these plurality of memory cells MC and the dummy cells DMC1 and DMC2 configure a memory string MS.

As shown in FIG. 2, select gate transistors S1 and S2 are respectively connected to both ends of the memory string MS. Control gates of the select gate transistors S1 and S2 are respectively connected to select gate lines SGD and SGS. Moreover, these memory string MS and select gate transistors S1 and S2 configure a NAND cell unit NU.

One end of the NAND cell unit NU is connected to the bit line BL via contacts Cb and V1. Moreover, the other end of the NAND cell unit NU is connected to a source line SL, via a substrate SB, a source contact LI, and a contact Cs.

Figure 3:
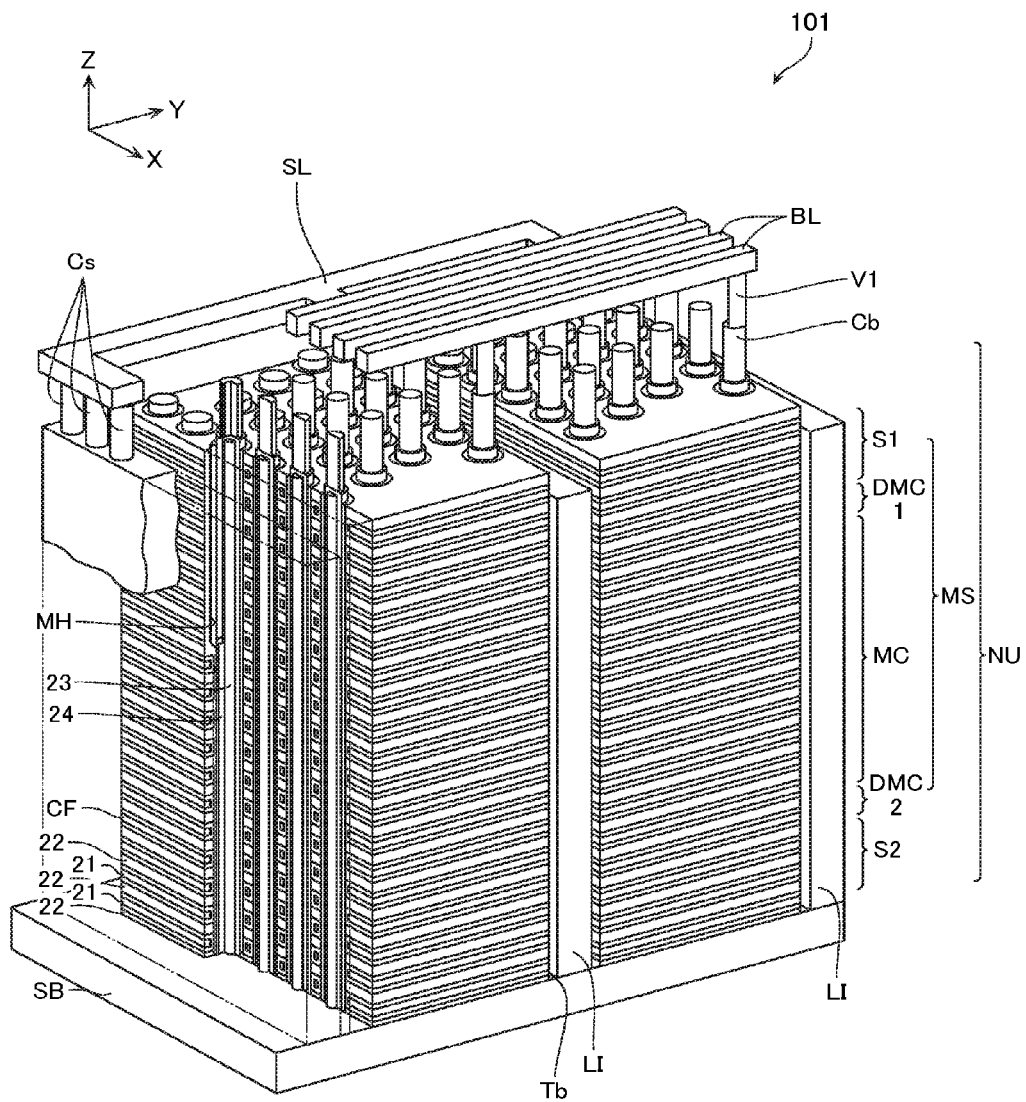
FIG. 3 is a perspective view showing a configuration of part of the same nonvolatile semiconductor memory device.
Figure 4:
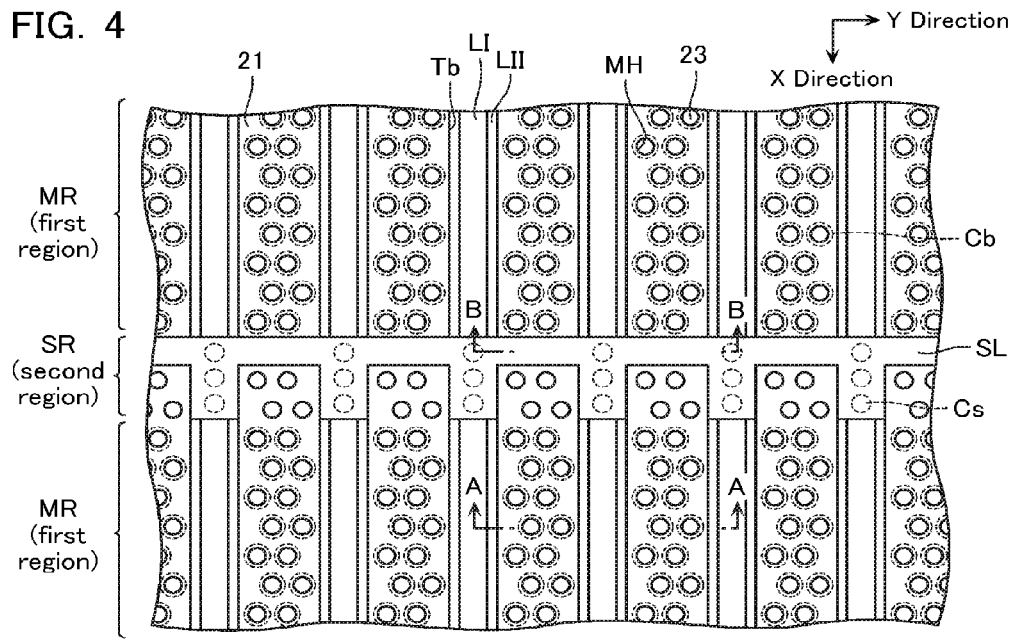
FIG. 4 is a plan view showing a configuration of part of the same nonvolatile semiconductor memory device.
Figure 5:
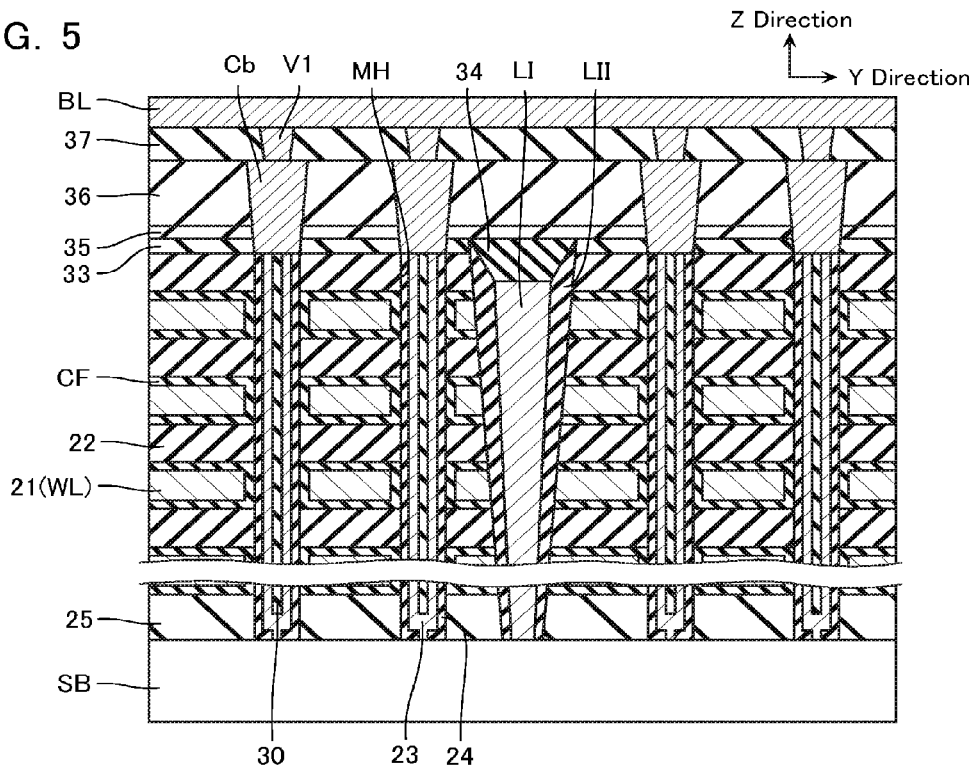
FIG. 5 is a cross-sectional view showing a configuration of part of the same nonvolatile semiconductor memory device.
Figure 6:
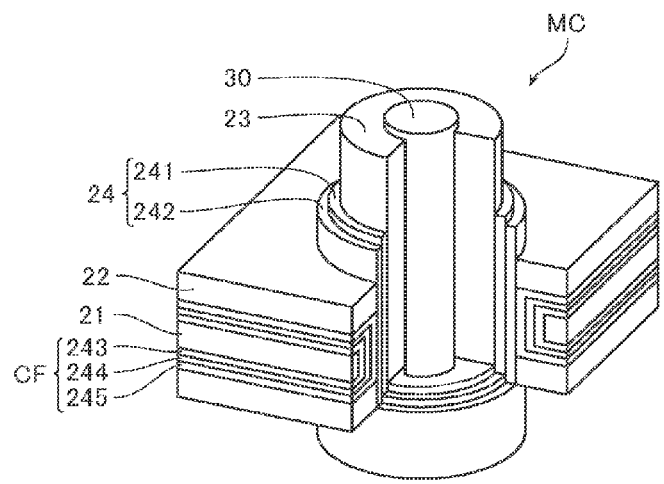
FIG. 6 is a perspective view showing a configuration of part of the same nonvolatile semiconductor memory device.
Figure 7:
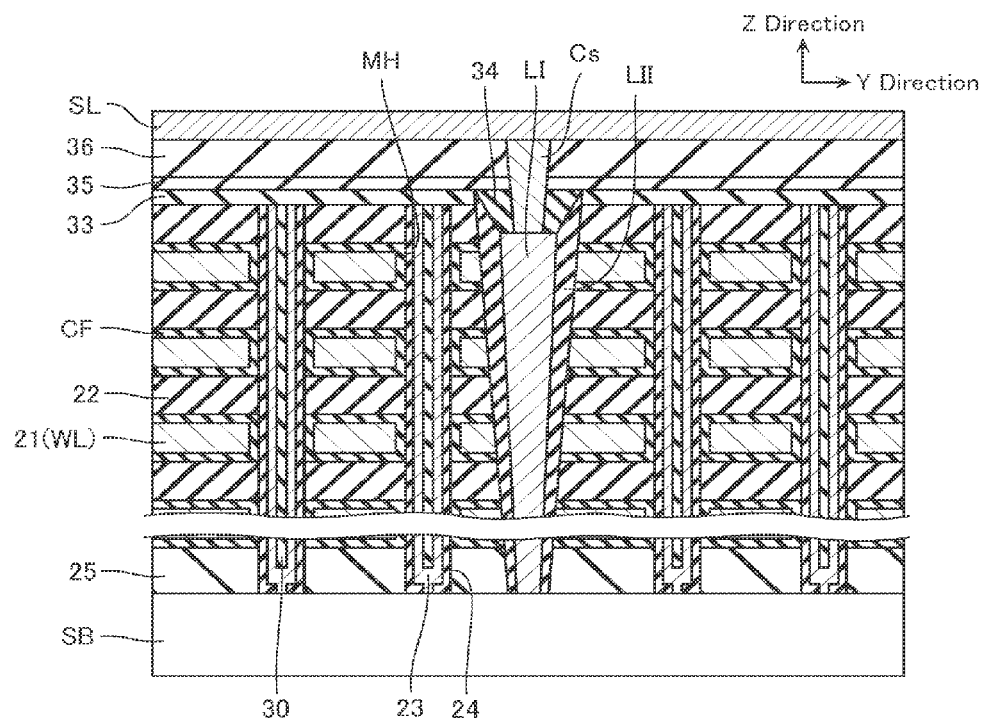
FIG. 7 is a cross-sectional view showing a configuration of part of the same nonvolatile semiconductor memory device.

Next, a configuration of the memory cell array 101 will be described with reference to FIGS. 3 to 7. FIG. 3 is a perspective view showing a configuration of part of the memory cell array 101. FIG. 4 is a plan view showing a configuration of part of the memory cell array 101. FIG. 5 is a cross-sectional view showing a configuration of part of the memory cell array 101, and shows a cross-section of a portion indicated by the line AA of FIG. 4. FIG. 6 is a perspective view showing a configuration of the memory cell MC. FIG. 7 is a cross-sectional view showing a configuration of part of the memory cell array 101, and shows a cross-section of a portion indicated by the line BB of FIG. 4. Note that in FIG. 4, part of the configuration, such as the bit line BL, is omitted.

As shown in FIG. 3, the memory cell array 101 has a structure in which inter-layer insulating layers 22 and conductive layers 21 are stacked alternately on a semiconductor substrate SB. Moreover, as shown in FIG. 5, formed in a periphery of the conductive layer 21 is a stacked film CF that includes a block insulating layer 245 (FIG. 6). The conductive layer 21 functions as the control gate of the memory cell MC (word line WL), as the source side select gate line SGS, and as the drain side select gate line SGD. The inter-layer insulating layers 22 are disposed above and below these conductive layers 21, and electrically insulate fellow conductive layers 21. The conductive layer 21 is configured from a metal of the likes of tungsten (W), for example, or from a material of a semiconductor layer such as polysilicon to which an impurity has been added. Moreover, the inter-layer insulating layer 22 is configured from a material having insulating properties, such as silicon oxide ($SiO_2$).

As shown in FIGS. 3 and 4, a stacked body of the inter-layer insulating layers 22 and the conductive layers 21 is divided in a Y direction via a trench Tb. Moreover, a sidewall of the trench Tb is provided with an inter-layer insulating layer LII (FIG. 5), and the source contact LI is provided between a pair of the inter-layer insulating layers LII. This source contact LI extends in an X direction and is connected at its lower surface to the semiconductor substrate SB.

In addition, as shown in FIG. 4, the inter-layer insulating layer 22, the conductive layer 21, and the source contact LI are partitioned in an XY plane into a memory region MR (first region) and a source contact region SR (second region) that are adjacent in the X direction. As shown in FIGS. 3 and 4, the inter-layer insulating layer 22 and the conductive layer 21 positioned in the memory region MR and the source contact region SR have a memory hole MH formed therein so as to penetrate the stacked body of the inter-layer insulating layers 22 and the conductive layers 21, and an inside of the memory hole MH is provided with a semiconductor layer 23. Moreover, as shown in FIGS. 3 and 4, an upper surface of the source contact LI positioned in the source contact region SR is connected to the source line SL via the contact Cs.

As shown in FIGS. 3 and 4, the memory holes MH are arranged staggered with a certain pitch in the XY plane. In addition, as shown in FIGS. 5 and 6, the memory hole MH has the following formed therein sequentially from its center, namely, a core insulating layer 30, the semiconductor layer 23, and a memory layer 24 that have a stacking direction (Z direction) as their longitudinal direction. Moreover, as shown in FIG. 6, the memory layer 24 comprises a tunnel insulating layer 241 and a charge accumulation layer 242 that are provided sequentially from a side of a side surface of the semiconductor layer 23. Furthermore, as shown in FIG. 6, the memory layer 24 faces the conductive layer 21 via the stacked film CF. The stacked film CF comprises a barrier metal 243, a block high dielectric film 244, and the block insulating layer 245 that are provided sequentially from a side of a side surface of the memory layer 24.

The memory cell MC according to the present embodiment adopts the semiconductor layer 23 as its channel and the conductive layer 21 as its control gate, and changes its threshold value by an amount of charge accumulated to the charge accumulation layer 242, thereby storing data. The tunnel insulating layer 241 and the block insulating layer 245 are formed from, for example, silicon oxide ($SiO_2$). Moreover, the charge accumulation layer 242 is formed from, for example, silicon nitride (SiN). The block high dielectric film 244 is formed from, for example, a metal oxide such as alumina ($Al_2O_3$) or a hafnium oxide ($HfO_x$). Moreover, the barrier metal 243 is formed from, for example, a metal nitride such as TiN, WN, or TaN.

As shown in FIG. 4, the memory region MR is provided with a plurality of the contacts Cb that connect the semiconductor layer 23 and the bit line BL. The contact Cb is not provided in the source contact region SR. Moreover, as shown in FIGS. 3 and 5, the semiconductor layer 23 positioned in the memory region MR is connected at its upper end to the bit line BL, via the contact Cb and the contact V1. The bit lines BL have the Y direction as their longitudinal direction and are arranged with a certain pitch in the X direction. Moreover, as shown in FIGS. 3 and 5, a lower end of the semiconductor layer 23 is connected to the semiconductor substrate SB.

As shown in FIG. 4, the source contact region SR is provided with a plurality of the contacts Cs that connect the source contact LI and the source line SL. The contact Cs is not provided in the memory region MR.

In addition, as shown in FIGS. 3 and 7, the source contact LI according to the present embodiment is connected at its lower end to the substrate SB, and is connected at its upper end to the source line SL via the contact Cs. Moreover, as shown in FIG. 7, in the present embodiment, a height of an upper surface of the source contact LI is formed lower than a height of an upper surface of the semiconductor layer 23. Note that as shown in FIGS. 3, 5, and 7, in the present embodiment, a height of an upper surface of a portion positioned in the source contact region SR, of the source contact LI matches a height of an upper surface of a portion thereof positioned in the memory region MR. Therefore, a height of a lower end of the contact Cs is also formed lower than a height of a lower end of the contact Cb. Moreover, in the present embodiment, a width in the Y direction of the lower end of the contact Cs is smaller than a width in the Y direction of the upper end of the source contact LI.

Now, when the height of the upper surface of the source contact LI is formed lower than the height of the upper surface of the semiconductor layer 23 as in the present embodiment, it is possible for the semiconductor memory device to be suitably manufactured, as will be mentioned in detail later.

[Method of Manufacturing]

Next, a method of manufacturing a nonvolatile semiconductor memory device according to the first embodiment will be described with reference to FIGS. 8 to 21. FIGS. 8 to 21 are cross-sectional views for explaining the method of manufacturing according to the first embodiment. Moreover, FIGS. 8 to 20, similarly to FIG. 5, show a cross-section of a position corresponding to the portion indicated by the line AA of FIG. 4. On the other hand, FIG. 21, similarly to FIG. 7, shows a cross-section of a position corresponding to the portion indicated by the line BB of FIG. 4.

Figure 8:
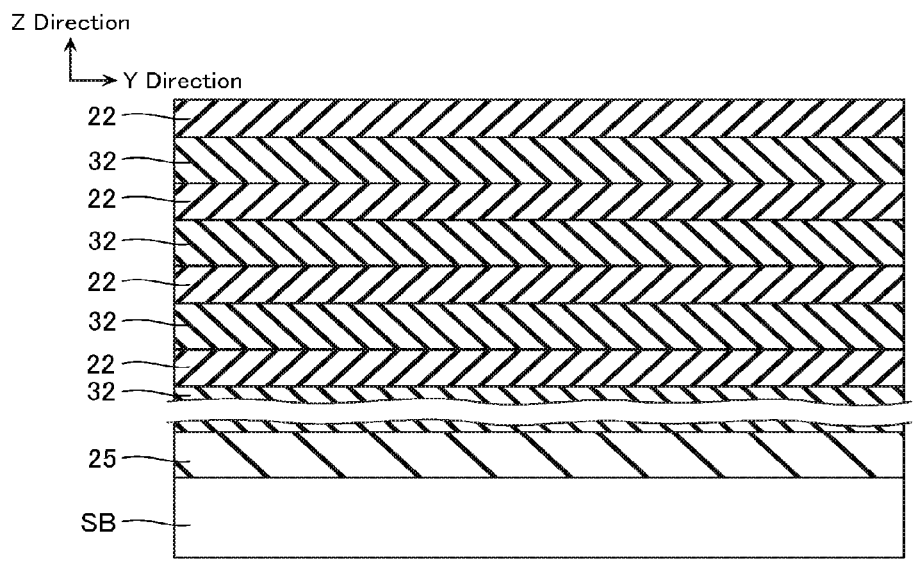
FIG. 8 is a cross-sectional view showing a manufacturing step of the same nonvolatile semiconductor memory device.

As shown in FIG. 8, an insulating layer 25 is stacked on the semiconductor substrate SB. In addition, a plurality of sacrifice layers 32 and the inter-layer insulating layers 22 are stacked alternately on the insulating layer 25. Note that the insulating layer 25 and the inter-layer insulating layer 22 are formed from, for example, silicon oxide ($SiO_2$). Moreover, the sacrifice layer 32 is formed from, for example, silicon nitride (SiN).

Figure 9:
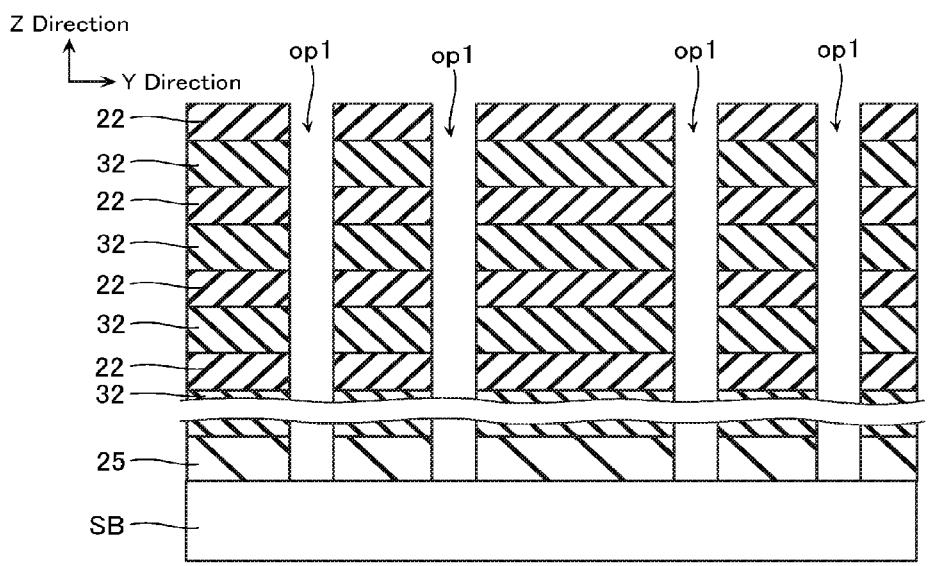
FIG. 9 is a cross-sectional view showing a manufacturing step of the same nonvolatile semiconductor memory device.

In addition, as shown in FIG. 9, openings op1 penetrating the insulating layer 25, the sacrifice layer 32, and the inter-layer insulating layer 22, are formed. The opening op1 will be the memory hole MH. Note that in the present embodiment, the opening op1 is formed in the memory region MR described with reference to FIG. 4.

Figure 10:
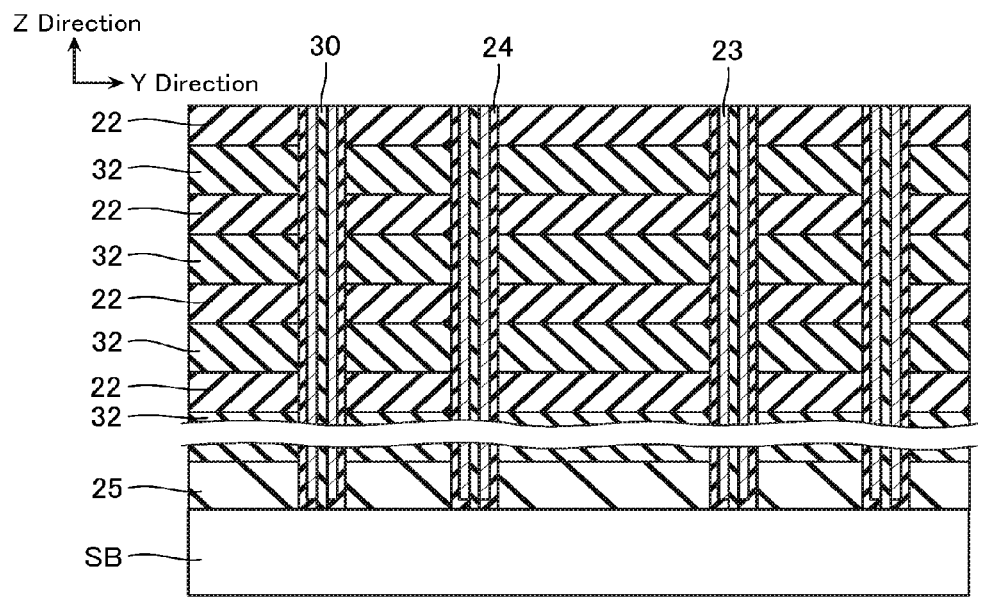
FIG. 10 is a cross-sectional view showing a manufacturing step of the same nonvolatile semiconductor memory device.

Moreover, as shown in FIG. 10, a memory layer formation layer 24, the semiconductor layer 23 and the core insulating layer 30, are formed. The memory layer formation layer 24 will be the memory layer 24. The semiconductor layer 23 is formed from the likes of polysilicon, for example. The memory layer 24 is formed from, for example, a stacked film of silicon nitride (SiN) and silicon oxide ($SiO_2$). The core insulating layer 30 is formed from, for example, silicon oxide ($SiO_2$).

Figure 11:
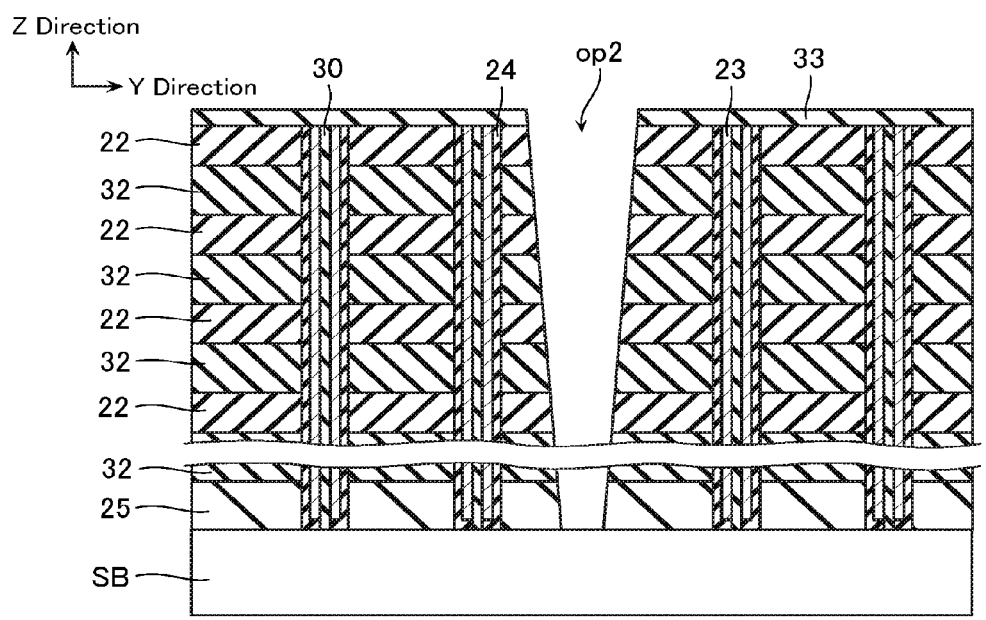
FIG. 11 is a cross-sectional view showing a manufacturing step of the same nonvolatile semiconductor memory device.

In addition, as shown in FIG. 11, an insulating layer 33 is formed on an upper surface of the inter-layer insulating layer 22, this insulating layer 33 is divided in the Y direction, and furthermore, an opening op2 dividing the insulating layer 25, the sacrifice layer 32, and the inter-layer insulating layer 22, is formed. The opening op2 will be the trench Tb. Moreover, the insulating layer 33 is configured from, for example, a material such as TEOS (Tetraethyl orthosilicate).

Figure 12:
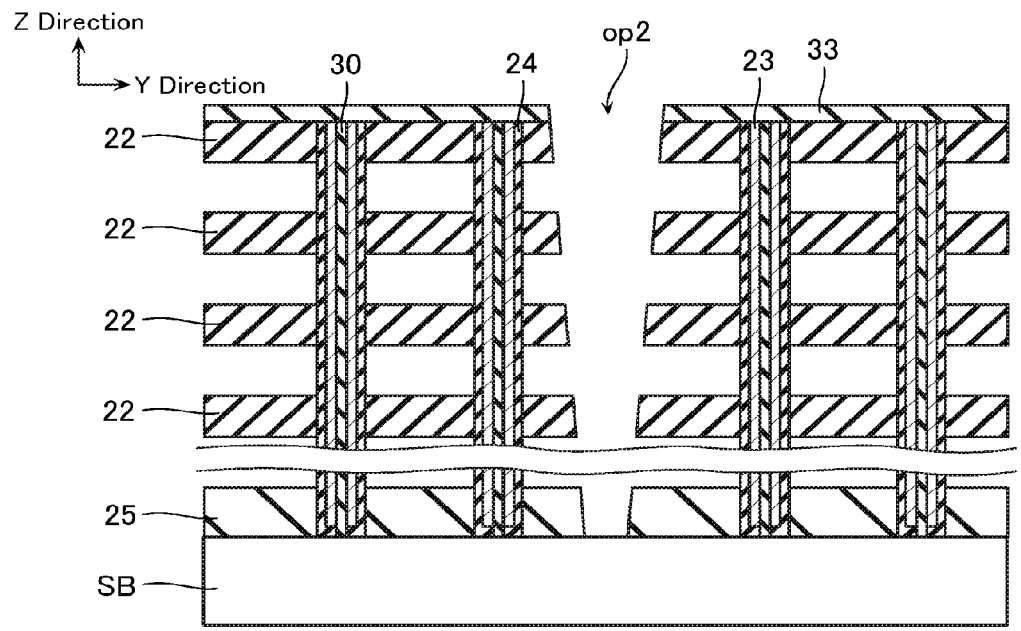
FIG. 12 is a cross-sectional view showing a manufacturing step of the same nonvolatile semiconductor memory device.

In addition, as shown in FIG. 12, the sacrifice layer 32 is removed via the opening op2. Removal of the sacrifice layer 32 is performed by, for example, wet etching using a phosphoric acid solution.

Figure 13:
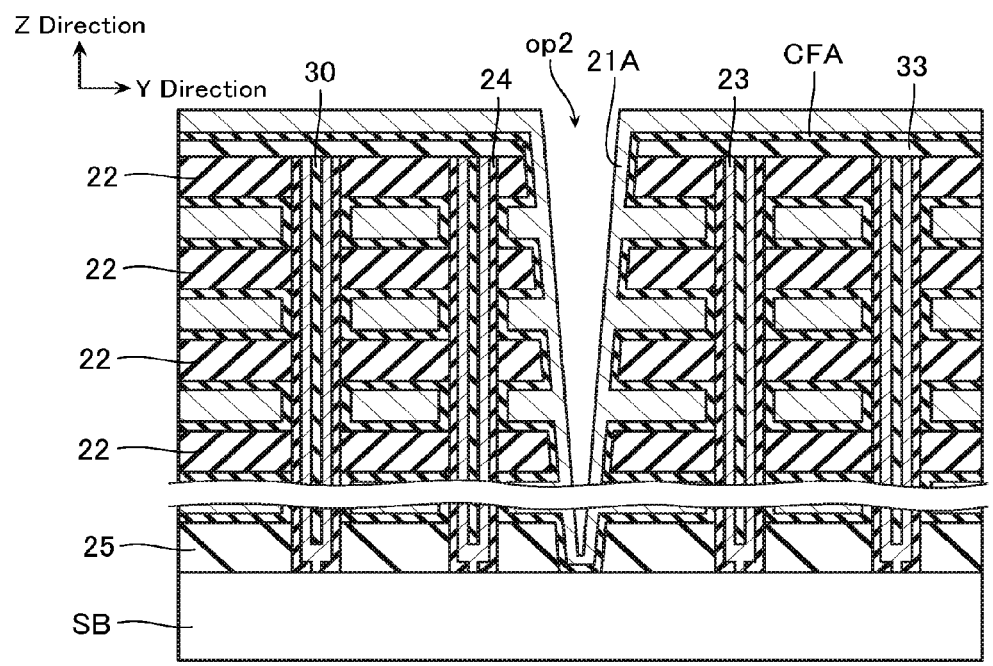
FIG. 13 is a cross-sectional view showing a manufacturing step of the same nonvolatile semiconductor memory device.

Moreover, as shown in FIG. 13, a stacked film formation layer CFA which will be the stacked film CF and a conductive layer 21A which will be the conductive layer 21 (word line WL), are formed via the opening op2.

Figure 14:
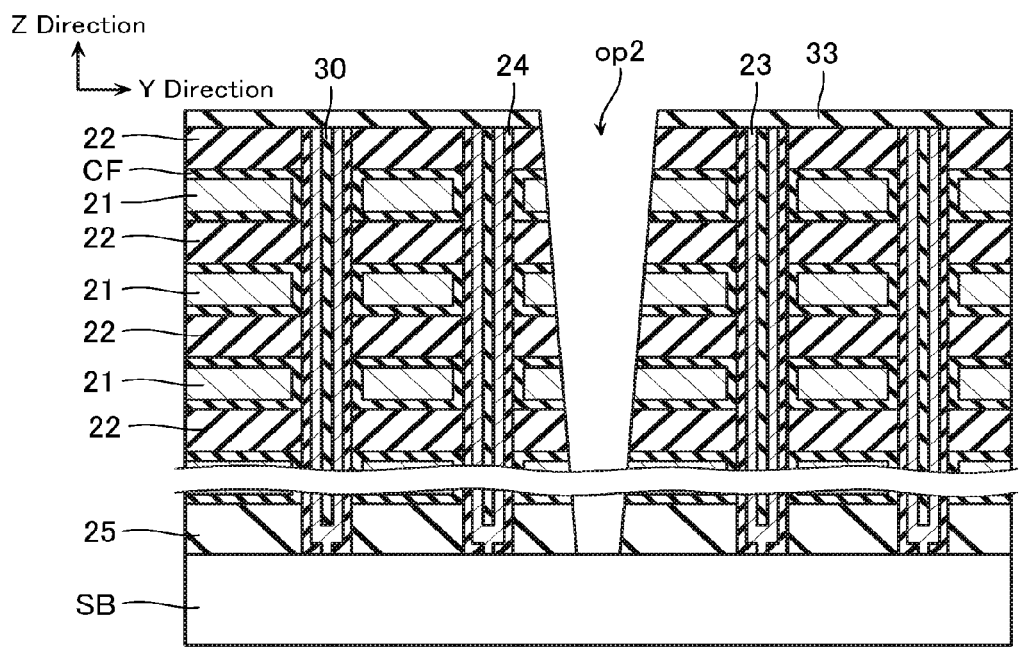
FIG. 14 is a cross-sectional view showing a manufacturing step of the same nonvolatile semiconductor memory device.

In addition, as shown in FIG. 14, parts of the conductive layer 21A and the stacked film formation layer CFA are removed, and the conductive layer 21A is divided in the Z direction, whereby the conductive layer 21 and the stacked film CF are formed.

Figure 15:
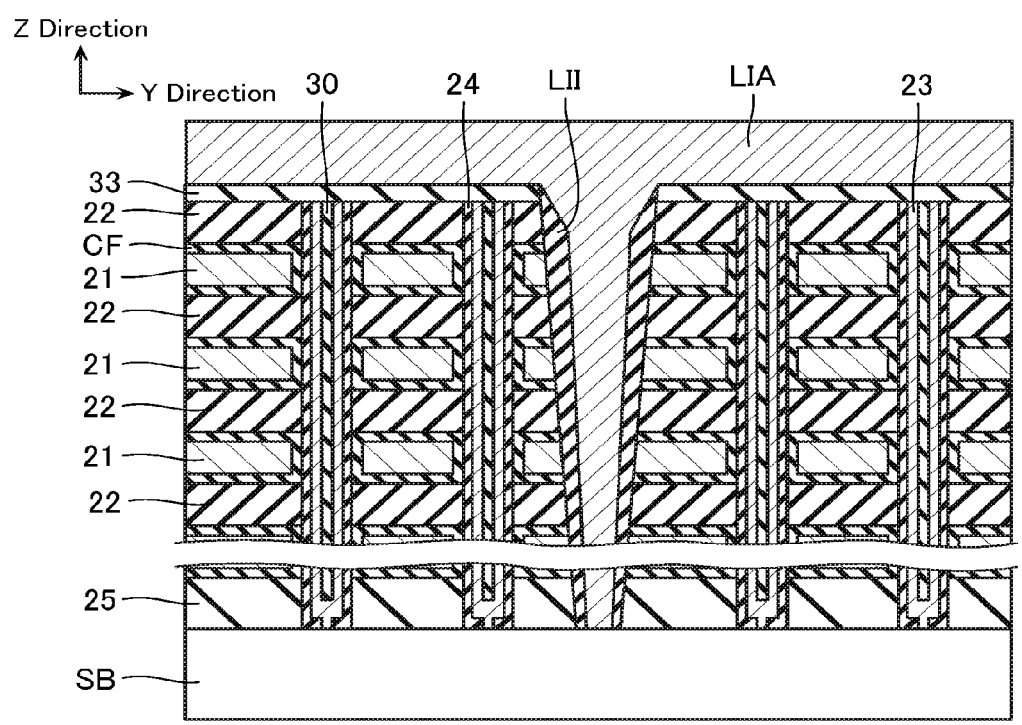
FIG. 15 is a cross-sectional view showing a manufacturing step of the same nonvolatile semiconductor memory device.

Moreover, as shown in FIG. 15, the inter-layer insulating layer LII is formed in the opening op2. In formation of the inter-layer insulating layer LII, for example, $SiO_2$ of a certain film thickness is deposited in the opening op2, and a portion covering a substrate SB upper surface, of the deposited $SiO_2$ is removed by anisotropic etching, and so on.

In addition, as shown in FIG. 15, a conductive layer LIA which will be the source contact LI, is formed in the opening op2. Note that another film, of the likes of titanium (Ti) or titanium nitride (TiN), may be formed between the conductive layer LIA and the inter-layer insulating layer LII.

Figure 16:
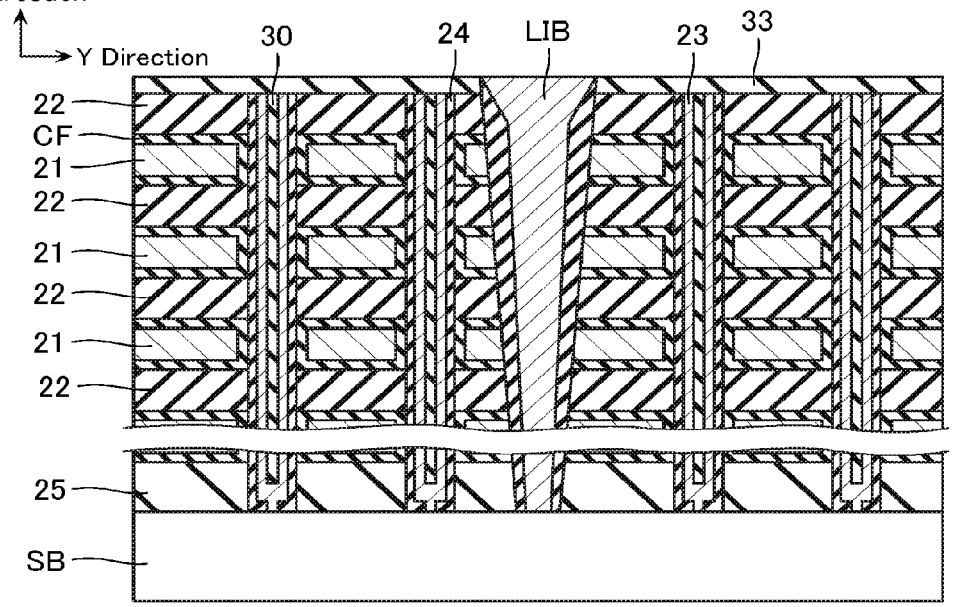
FIG. 16 is a cross-sectional view showing a manufacturing step of the same nonvolatile semiconductor memory device.

Moreover, as shown in FIG. 16, a means such as CMP is performed using the insulating layer 33 as a stopper, and a portion covering an upper surface of the insulating layer 33, of the conductive layer LIA is removed, whereby a conductive layer LIB is formed.

Figure 17:
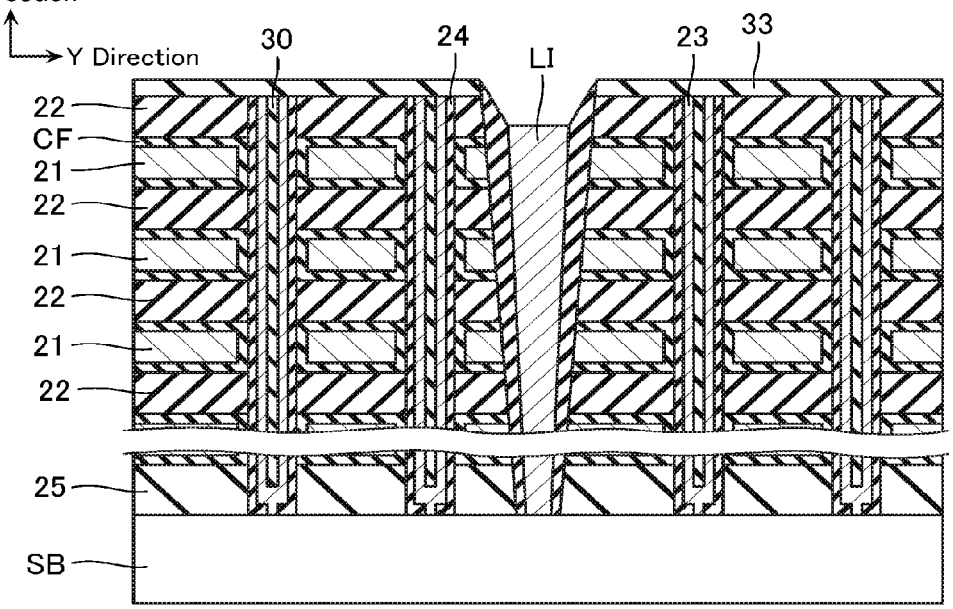
FIG. 17 is a cross-sectional view showing a manufacturing step of the same nonvolatile semiconductor memory device.

In addition, as shown in FIG. 17, a means such as etching back is performed, and a position of an upper surface of the conductive layer LIB is lowered, whereby the source contact LI is formed. In this step, an upper surface of the source contact LI is made lower than an upper surface of the semiconductor layer 23. Note that in this step, for example, a means such as etching back by dry etching (Dry Etchback) may be employed.

Figure 18:
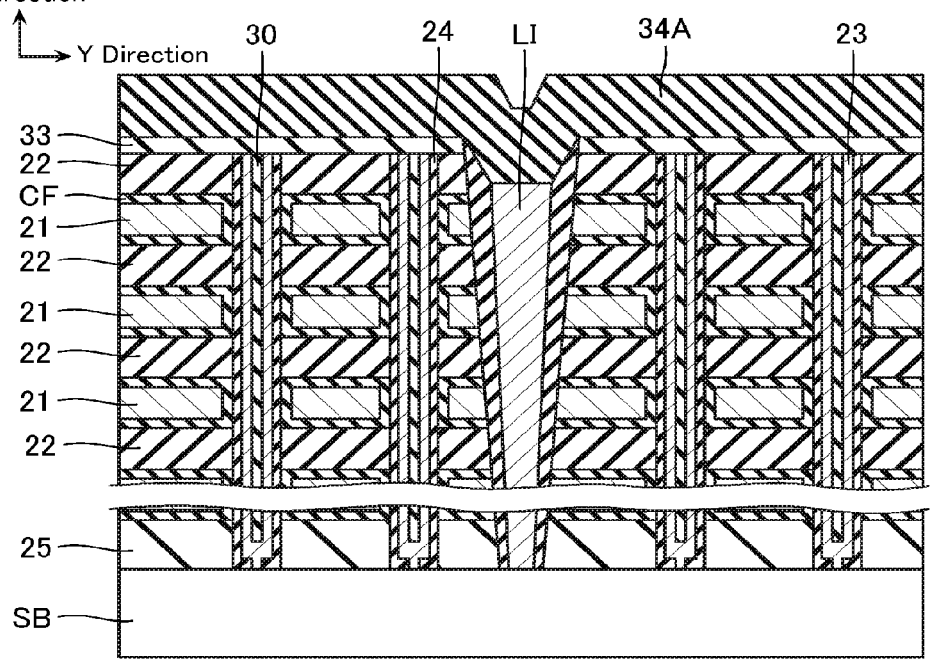
FIG. 18 is a cross-sectional view showing a manufacturing step of the same nonvolatile semiconductor memory device.

Moreover, as shown in FIG. 18, an insulating layer 34A which will be an insulating layer 34, is formed on upper surfaces of the source contact LI and the insulating layer 33. The insulating layer 34A may be, for example, a stacked film of silane ($SiH_4$) and TEOS.

Figure 19:
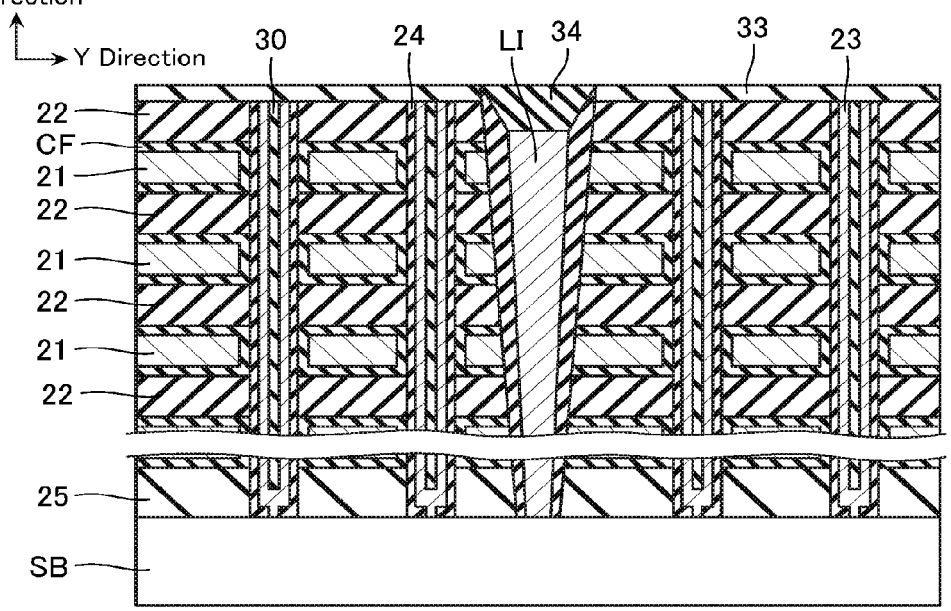
FIG. 19 is a cross-sectional view showing a manufacturing step of the same nonvolatile semiconductor memory device.

In addition, as shown in FIG. 19, a portion covering the upper surface of the insulating layer 33, of the insulating layer 34A is removed by a planarization process, such as CMP, whereby the insulating layer 34 is formed.

Figure 20:
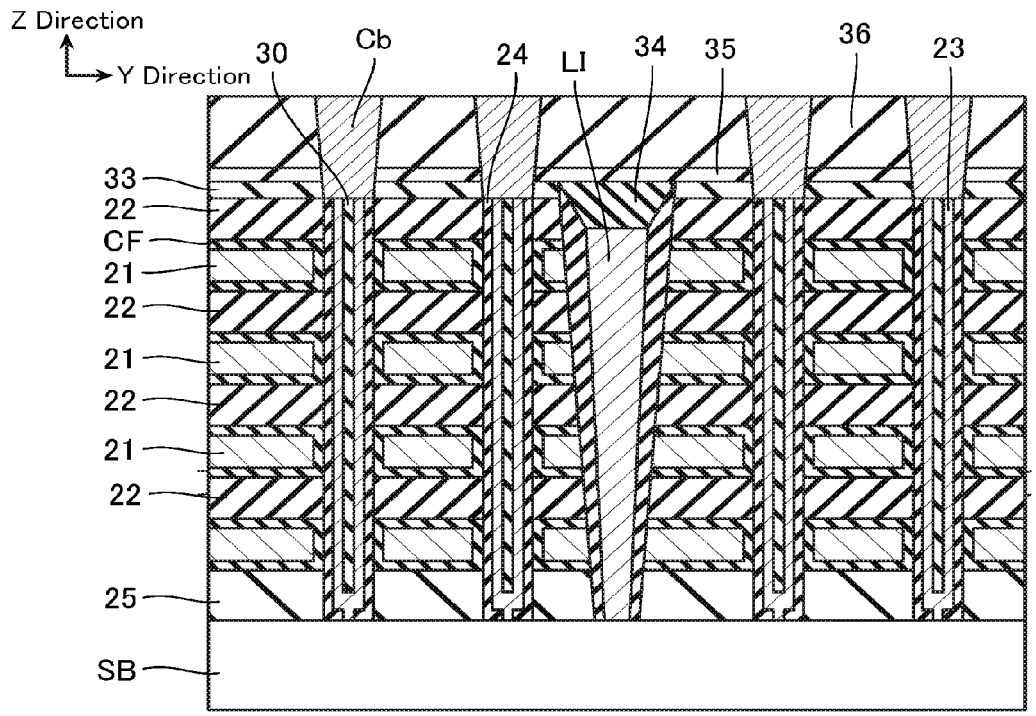
FIG. 20 is a cross-sectional view showing a manufacturing step of the same nonvolatile semiconductor memory device.

Moreover, as shown in FIG. 20, an insulating layer 35 and an insulating layer 36 are formed on upper surfaces of the insulating layer 34 and the insulating layer 33. In addition, as shown in FIG. 20, a contact hole is formed in a portion positioned on an upper portion of the semiconductor layer 23, of the insulating layer 33, the insulating layer 35, and the insulating layer 36, and the contact Cb is formed in this contact hole. Note that as described with reference to FIG. 4, the contact Cb is formed in the memory region MR. Note that the insulating layer 35 may be formed from, for example, silicon nitride (SiN). Moreover, the insulating layer 36 may be formed from, for example, TEOS.

Figure 21:
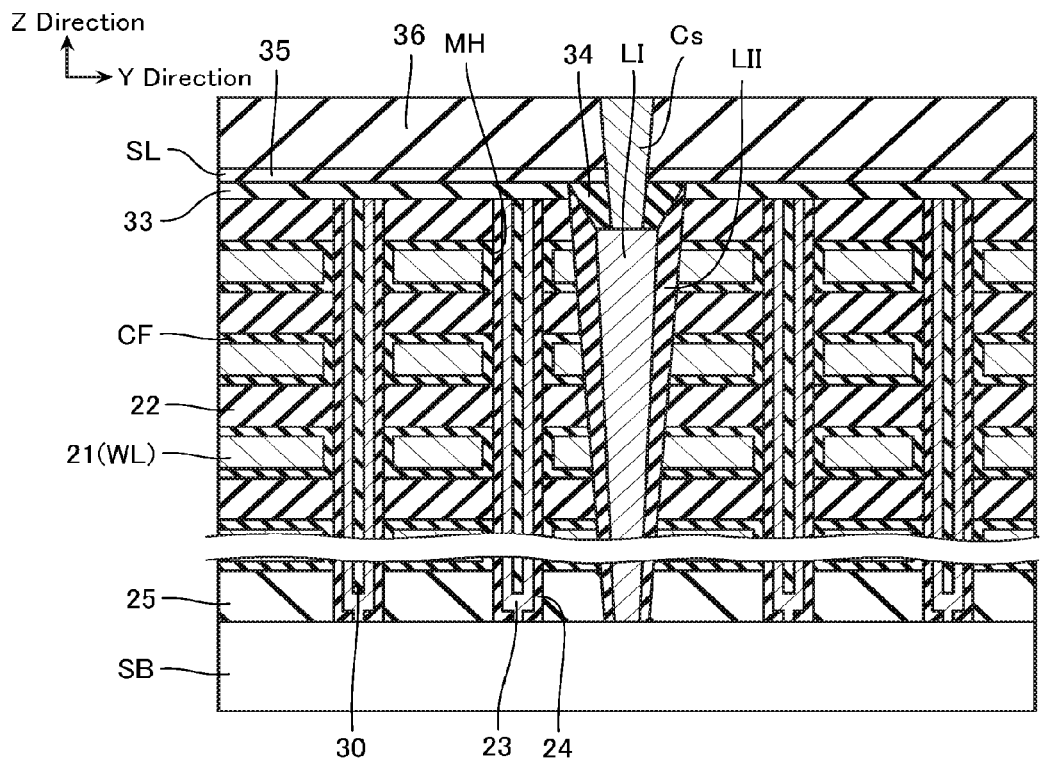
FIG. 21 is a cross-sectional view showing a manufacturing step of the same nonvolatile semiconductor memory device.

In addition, as shown in FIG. 21, a contact hole is formed in the insulating layer 35, the insulating layer 36, and the insulating layer 34, and the contact Cs is formed in this contact hole. Note that as described with reference to FIG. 4, the contact Cs is formed in the source contact region SR. Moreover, in the present embodiment, positioning of the contact Cs is performed independently in a different step to positioning of the contact Cb.

Furthermore, the likes of the bit line BL or the source line SL are formed, thereby making it possible to manufacture the semiconductor memory device described with reference to FIGS. 3 to 6.

Figure 22:
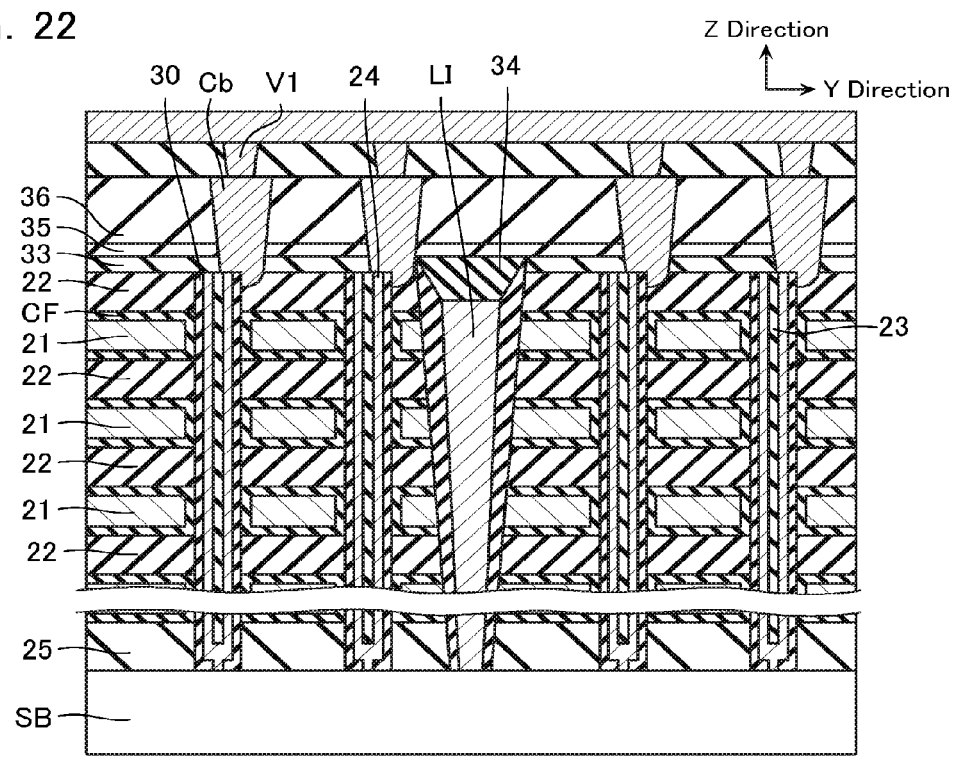
FIG. 22 is a schematic cross-sectional view for explaining a phenomenon that may occur in a manufacturing step of the same nonvolatile semiconductor memory device.

Next, a phenomenon that may occur in a manufacturing step of the semiconductor memory device according to the present embodiment will be described with reference to FIG. 22. FIG. 22 is a schematic cross-sectional view for explaining the same phenomenon.

As described with reference to FIG. 20, in the method of manufacturing according to the present embodiment, a contact hole is formed in a portion positioned on an upper portion of the semiconductor layer 23, of the insulating layer 35 and the insulating layer 36, and the contact Cb is formed in this contact hole. Now, as shown in FIG. 22, as miniaturization of the semiconductor memory device proceeds, the contact Cb sometimes gets out of alignment in the Y direction from a desired position. When the contact Cb being out of alignment in the Y direction results in the contact Cb ending up contacting the source contact LI, a short-circuit sometimes ends up occurring between the bit line BL and the source line SL. Moreover, it is also preferable from a viewpoint of withstand voltage that a distance between the contact Cb and the source contact LI is maintained at a certain value or more.

Accordingly, in the present embodiment, as shown in FIG. 22, the height of the upper surface of the source contact LI is made lower than the height of the upper surface of the semiconductor layer 23. As a result, as shown in FIG. 22, even when the contact Cb is out of alignment in the Y direction, a short-circuit between the contact Cb and the source contact LI can be prevented, and furthermore, a withstand voltage between the contact Cb and the source contact LI can be secured.

Moreover, in the present embodiment, a position in the Y direction of a semiconductor layer 23 upper end and a position in the Y direction of a source contact LI upper end sometimes end up deviating independently from a design value. That is, an amount or direction of an error with respect to the design value of the position in the Y direction of the upper end sometimes ends up differing between the semiconductor layer 23 and the source contact LI. Accordingly, in the present embodiment, as described with reference to FIGS. 20 and 21, positioning of the contact Cb and the contact Cs are performed independently in different steps. This makes it possible for the contact Cb to be suitably contacted with the semiconductor layer 23, and furthermore, for the contact Cs to be suitably contacted with the source contact LI.

Second Embodiment

Figure 23:
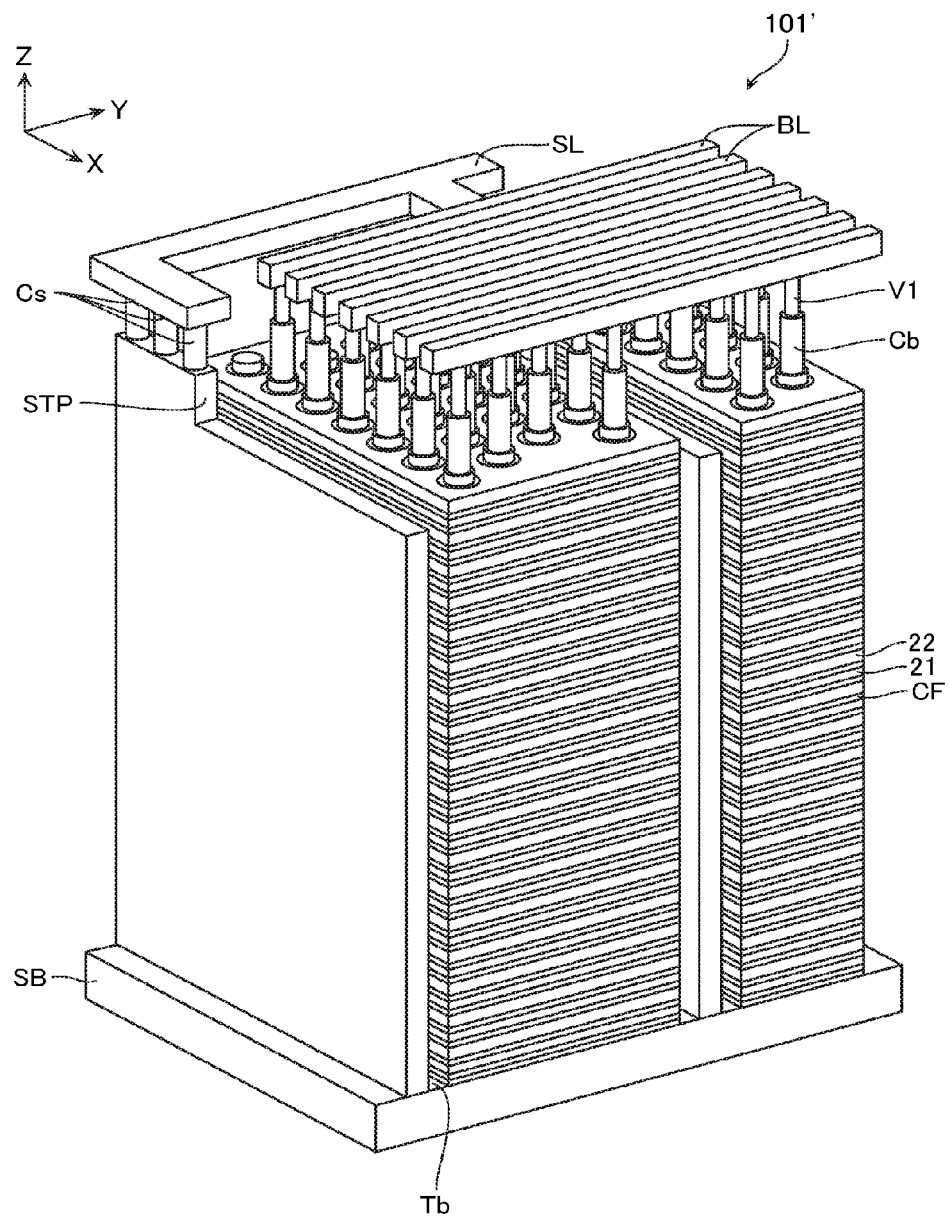
FIG. 23 is a perspective view showing a configuration of part of a nonvolatile semiconductor memory device according to a second embodiment.
Figure 24:
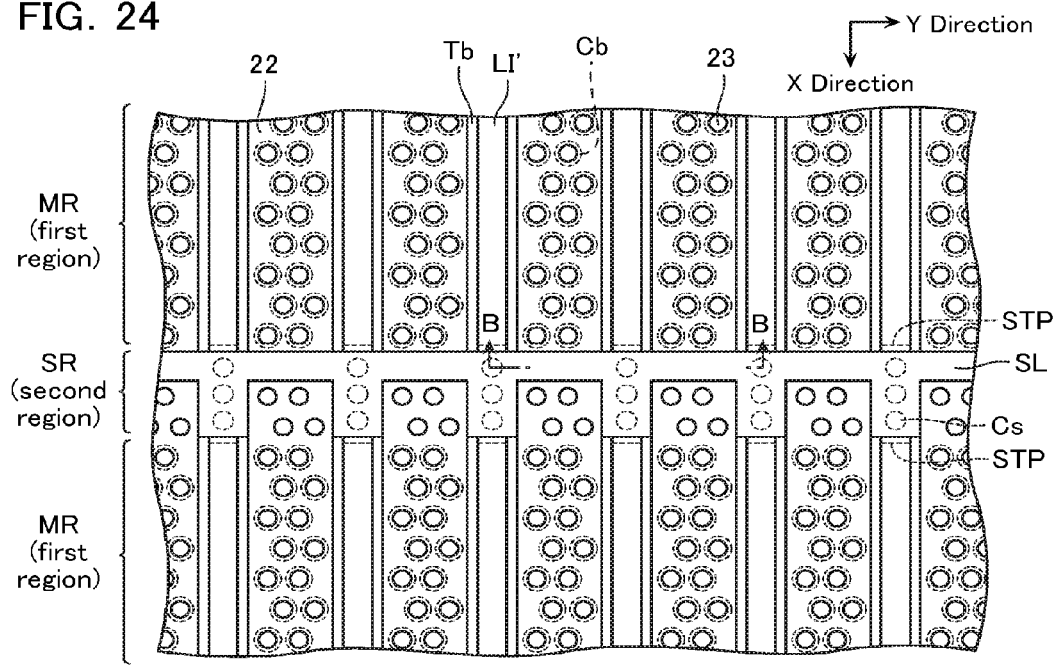
FIG. 24 is a plan view showing a configuration of part of the same nonvolatile semiconductor memory device.
Figure 25:
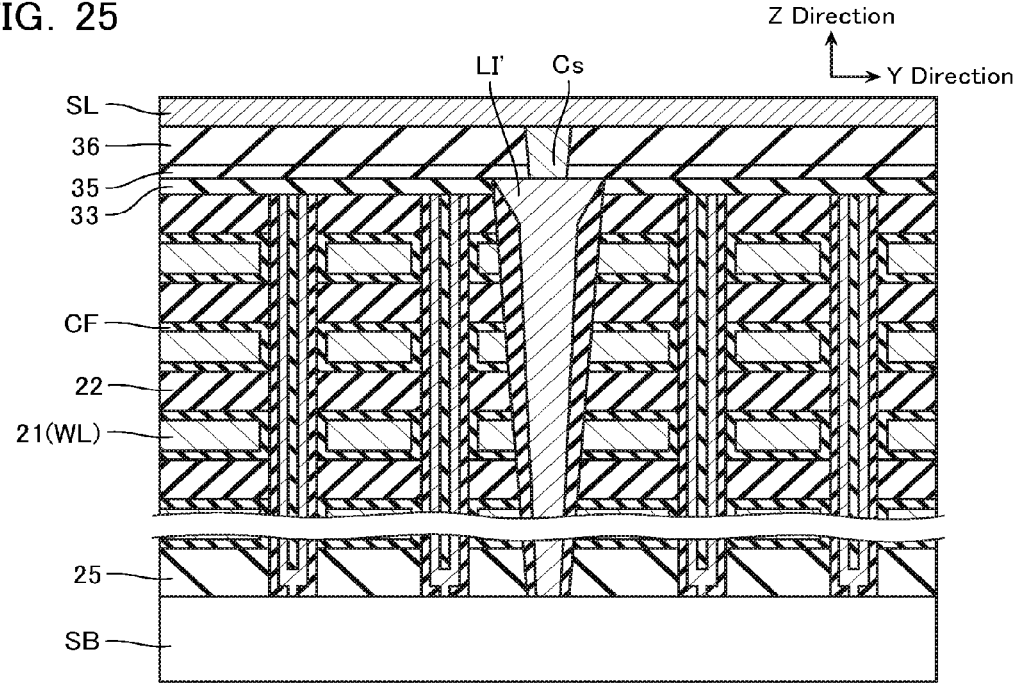
FIG. 25 is a cross-sectional view showing a configuration of part of the same nonvolatile semiconductor memory device.

Next, a semiconductor memory device according to a second embodiment will be described with reference to FIGS. 23 to 25. FIG. 23 is a perspective view showing a configuration of the semiconductor memory device according to the second embodiment. FIG. 24 is a plan view showing a configuration of part of the same semiconductor memory device. FIG. 25 is a cross-sectional view showing a configuration of part of the same semiconductor memory device, and shows a cross-section of a portion indicated by the line BB of FIG. 24. Note that in the description below, portions similar to those of the semiconductor memory device according to the first embodiment are assigned with identical reference symbols to those assigned in the first embodiment, and descriptions thereof will be omitted. Moreover, in FIG. 24, part of the configuration is omitted.

As shown in FIGS. 23 and 24, the semiconductor memory device according to the present embodiment is basically configured similarly to the semiconductor memory device according to the first embodiment. However, as shown in FIGS. 23 to 25, in the present embodiment, a height of an upper surface of a source contact LI' is formed higher than the upper surface of the semiconductor layer 23 in the source contact region SR. In other words, the source contact LI' has a step STP between the memory region MR and the source contact region SR. Note that dotted lines on the source contacts LI' in FIG. 24 shows the step STP. As shown in FIG. 25, in the present embodiment, the height of the upper surface of the source contact LI' matches a height of the upper surface of the insulating layer 33 in the source contact region SR. Note that the height of the upper surface of the source contact LI' in the memory region MR is lower than the upper surface of the semiconductor layer 23, similarly to in the first embodiment (refer to FIG. 5).

The semiconductor memory device according to the present embodiment is manufactured as follows. For example, steps up to the step shown in FIG. 16 are performed similarly to those for the semiconductor memory device according to the first embodiment. Moreover, a portion positioned in the source contact region SR of LIB is covered by a mask, or the like. In addition, as shown in FIG. 17, a means such as etching back is performed, and a position of an upper surface of a portion positioned in the memory region MR, of the conductive layer LIB is lowered, whereby the source contact LI' is formed. In this step, the upper surface of the source contact LI' is made lower than the upper surface of the semiconductor layer 23 in the memory region MR. Moreover, the mask, or the like, is removed and the steps described with reference to FIGS. 18 and 19 are performed. In addition, contact holes are formed in a portion positioned on the upper portion of the semiconductor layer 23 and positioned in the memory region MR and in a portion positioned on the upper portion of the source contact LI' and positioned in the source contact region SR, of the insulating layer 33, the insulating layer 34, the insulating layer 35, and the insulating layer 36, and the contact Cb and the contact Cs are formed in these contact holes. Note that in the present embodiment, positioning of the contact Cb and the contact Cs are performed in a batch in an identical step.

In the present embodiment, the upper surface of LIB forming the source contact LI' is not lowered in the source contact region SR. Now, there is a tendency for a width in the Y direction of the source contact LI' to be smaller the more downwardly positioned is a portion thereof, and to be larger the more upwardly positioned is a portion thereof. Therefore, in the present embodiment, as shown in FIGS. 7 and 25, the width in the Y direction of the source contact LI' upper surface in the source contact region SR can be made broader compared to in the first embodiment. As a result, even if a position in the Y direction of an upper end of the semiconductor layer 23 or source contact LI' differs to a certain extent from a design value, formation of the contact can be performed in a batch. Therefore, the semiconductor memory device according to the present embodiment can be manufactured at a lower price compared to the semiconductor memory device according to the first embodiment. Note that in the second embodiment, it is also possible for the contact Cb and the contact Cs to be formed in different steps.

Moreover, in the above described embodiments, the semiconductor layer 23 and the source contact were connected via an upper surface of the substrate SB configured from the likes of silicon. However, the semiconductor layer 23 and the contact may be connected at their lower ends by a conductive layer of the likes of a metal or polysilicon. In this case, for example, a wiring line layer including the likes of a metal or polysilicon, and so on, may be formed above the substrate SB.

OTHERS

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
    a memory string comprising a plurality of memory cells connected in series therein; and
    a contact electrically connected to one end of the memory string,
    the memory string comprising:
    a plurality of control gate electrodes stacked above a first semiconductor layer;
    a second semiconductor layer having one end connected to the first semiconductor layer and having as its longitudinal direction a direction perpendicular to the first semiconductor layer, the second semiconductor layer facing the plurality of control gate electrodes; and
    a charge accumulation layer positioned between the control gate electrode and the second semiconductor layer,
    the contact having a plate-like shape whose longitudinal direction is a first direction, the contact having its lower surface connected to the first semiconductor layer, and the contact having a height of at least part of its upper surface lower than a height of an upper surface of the second semiconductor layer.

2. The semiconductor memory device according to claim 1, comprising
    a first region and a second region on the first semiconductor layer, the first region and the second region being adjacent in the first direction,
    wherein the control gate electrode and the contact are positioned in the first region and the second region, and
    a height of a portion positioned in the first region, of the contact is lower than the height of the upper surface of the second semiconductor layer.

3. The semiconductor memory device according to claim 2, further comprising:
    a first upper layer contact provided in the second region and connected to the upper surface of the contact; and
    a second upper layer contact provided in the first region and connected to the upper surface of the second semiconductor layer.

4. The semiconductor memory device according to claim 3, wherein
    assuming a direction parallel to the first semiconductor layer and intersecting the first direction to be a second direction,
    a width in the second direction of a lower end of the first upper layer contact is smaller than a width in the second direction of an upper end of the contact.

5. The semiconductor memory device according to claim 2, wherein a height of a portion positioned in the second region, of the contact is higher than the height of the upper surface of the second semiconductor layer.

6. The semiconductor memory device according to claim 1, comprising
a plurality of first regions and a plurality of second regions on the first semiconductor layer, the plurality of first regions being provided in the first direction, and the plurality of second regions being provided between the plurality of first regions provided in the first direction, the semiconductor memory device further comprising:
a first upper layer contact provided in the second region and connected to the upper surface of the contact;
a second upper layer contact provided in the first region and connected to the upper surface of the second semiconductor layer; and
a first wiring line connected to the contact via the first upper layer contact,
wherein the first wiring line is positioned in the second region and has as its longitudinal direction a second direction intersecting the first direction.

7. The semiconductor memory device according to claim 6, wherein
the second upper layer contact comprises two via contact wiring lines stacked in the direction perpendicular to the first semiconductor layer, and
a height of a lower surface of a downwardly positioned one of the two via contact wiring lines is higher than a height of a lower surface of the first upper layer contact.

8. A method of manufacturing a semiconductor memory device, the semiconductor memory device comprising a memory string that comprises a plurality of memory cells connected in series therein, and a contact electrically connected to one end of the memory string, the method comprising:
forming
a plurality of control gate electrodes stacked above a first semiconductor layer,
a second semiconductor layer having one end connected to the first semiconductor layer, having as its longitudinal direction a direction perpendicular to the first semiconductor layer, and facing the plurality of control gate electrodes,
a charge accumulation layer positioned between the control gate electrode and the second semiconductor layer, and
the contact having a plate-like shape whose longitudinal direction is a first direction, and having its lower surface connected to the first semiconductor layer; and
making a height of at least part of an upper surface of the contact lower than a height of an upper surface of the second semiconductor layer.

9. The method of manufacturing a semiconductor memory device according to claim 8, wherein
the semiconductor memory device comprises a first region and a second region that are adjacent in the first direction,
the control gate electrode and the contact are formed in the first region and the second region, and
a height of a portion positioned in the first region, of the contact is formed so as to be lower than the height of the upper surface of the second semiconductor layer.

10. The method of manufacturing a semiconductor memory device according to claim 9, further comprising:
forming in the second region a first upper layer contact connected to the upper surface of the contact; and
forming in the first region a second upper layer contact connected to the upper surface of the second semiconductor layer.

11. The method of manufacturing a semiconductor memory device according to claim 8, further comprising:
alternately stacking a plurality of first insulating layers and second insulating layers above the first semiconductor layer;
forming a first trench that extends in the first direction and divides the plurality of first insulating layers and second insulating layers;
forming a second inter-layer insulating layer that covers a sidewall of the first trench;
forming a contact formation layer contacting at its lower surface the first semiconductor layer and forming the contact; and
making a height of at least part of an upper surface of the contact formation layer lower than the height of the upper surface of the second semiconductor layer to form the contact.

12. The method of manufacturing a semiconductor memory device according to claim 9, wherein
a height of a portion positioned in the second region, of the contact is formed lower than the height of the upper surface of the second semiconductor layer.

13. The method of manufacturing a semiconductor memory device according to claim 12, further comprising:
after forming the contact,
forming a third inter-layer insulating layer that covers the upper surfaces of the contact and the second semiconductor layer;
forming a first opening in a portion positioned in the second region and positioned above the contact, of the third inter-layer insulating layer;
forming a second opening in a portion positioned in the first region and positioned above the second semiconductor layer, of the third inter-layer insulating layer,
wherein positions of the first opening and the second opening are positioned independently in different steps.

14. The method of manufacturing a semiconductor memory device according to claim 9, wherein
a height of a portion positioned in the second region, of the contact is formed higher than the height of the upper surface of the second semiconductor layer.

15. The method of manufacturing a semiconductor memory device according to claim 14, further comprising:
after forming the contact,
forming a third inter-layer insulating layer that covers the upper surfaces of the contact and the second semiconductor layer;
forming a first opening in a portion positioned in the second region and positioned above the contact, of the third inter-layer insulating layer;
forming a second opening in a portion positioned in the first region and positioned above the second semiconductor layer, of the third inter-layer insulating layer,
wherein positions of the first opening and the second opening are positioned in a batch in an identical step.

16. A semiconductor memory device, comprising
a first region and a second region on a first semiconductor layer, the first region and the second region being adjacent in a first direction,
the semiconductor memory device further comprising:
a plurality of first conductive layers stacked in the first region and the second region, on the first semiconductor layer;

a second semiconductor layer having one end connected to the first semiconductor layer and having as its longitudinal direction a direction perpendicular to the first semiconductor layer, the second semiconductor layer facing the plurality of first conductive layers;

a charge accumulation layer positioned between the first conductive layer and the second semiconductor layer; and a contact provided in the first region and the second region on the first semiconductor layer, the contact having its lower surface connected to the first semiconductor layer, and the contact having a height of at least part of its upper surface in the first region lower than a height of an upper surface of the second semiconductor layer.

17. The semiconductor memory device according to claim 16, further comprising:

a first upper layer contact provided in the second region and connected to the upper surface of the contact; and a second upper layer contact provided in the first region and connected to the upper surface of the second semiconductor layer.

18. The semiconductor memory device according to claim 16, wherein a height of a portion positioned in the second region, of the contact is higher than the height of the upper surface of the second semiconductor layer.

* * * * *